(12) United States Patent
Lee

(10) Patent No.: US 9,614,154 B2
(45) Date of Patent: Apr. 4, 2017

(54) ELECTRONIC DEVICE AND METHOD FOR FABRICATING THE SAME

(71) Applicant: SK hynix Inc., Icheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 281 days.

(21) Appl. No.: 14/526,988

(22) Filed: Oct. 29, 2014

(65) Prior Publication Data

US 2016/0043313 A1 Feb. 11, 2016

(30) Foreign Application Priority Data

Aug. 11, 2014 (KR) ........................ 10-2014-0103419

(51) Int. Cl.
*H01L 45/00* (2006.01)
*H01L 27/24* (2006.01)
*G06F 3/06* (2006.01)
*H01L 27/22* (2006.01)

(52) U.S. Cl.
CPC .......... *H01L 45/1675* (2013.01); *G06F 3/064* (2013.01); *G06F 3/0604* (2013.01); *G06F 3/0673* (2013.01); *H01L 27/222* (2013.01); *H01L 27/2463* (2013.01); *H01L 45/04* (2013.01); *H01L 45/06* (2013.01); *H01L 45/08* (2013.01); *H01L 45/1233* (2013.01); *H01L 45/141* (2013.01); *H01L 45/146* (2013.01); *H01L 45/147* (2013.01); *H01L 45/165* (2013.01)

(58) Field of Classification Search
CPC ... H01L 45/1675; H01L 45/08; H01L 45/146; H01L 45/04; H01L 45/06
See application file for complete search history.

(56) References Cited

U.S. PATENT DOCUMENTS

2010/0159638 A1* 6/2010 Jeong ...................... H01L 27/24
438/102

FOREIGN PATENT DOCUMENTS

KR 10-2014-0126587 A 10/2014

* cited by examiner

*Primary Examiner* — Douglas Menz

(57) ABSTRACT

An electronic device includes a semiconductor memory. The semiconductor memory includes first lines extending in a first direction; second lines extending in a second direction crossing the first direction; insulating patterns interposed between the first and second lines at first intersections of the first and second lines; and variable resistance patterns interposed between the first and the second lines at second intersections of the first and second lines. A central intersection is defined by respective central lines of the first and second lines and corresponds to a coordinate (0, 0). The first intersections are located on first to $(n+1)^{th}$ virtual lines, the $(n+1)^{th}$ virtual line having a polygonal shape in which vertexes correspond to coordinates $(-(k-n), 0)$, $(k-n, 0)$, $(0, k-n)$ and $(0, -(k-n))$ where k is a natural number and n is an integer in a range of 0 to $(k-1)$.

19 Claims, 14 Drawing Sheets

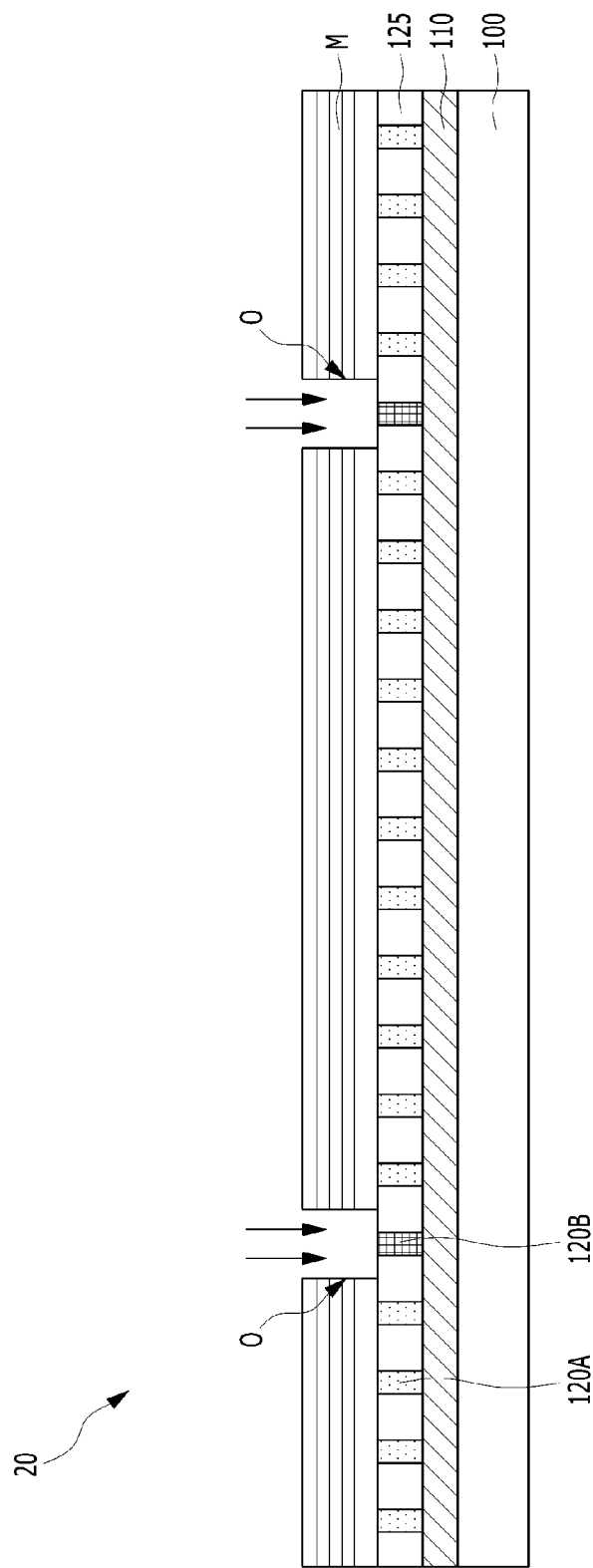

ELECTRONIC DEVICE AND METHOD FOR FABRICATING THE SAME

CROSS-REFERENCE TO RELATED APPLICATION

The present application claims priority to Korean Patent Application No. 10-2014-0103419, entitled "ELECTRONIC DEVICE AND METHOD FOR FABRICATING THE SAME" and filed on Aug. 11, 2014, which is incorporated by reference herein in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device can improve a performance characteristic thereof by controlling a sneak current in a cell array having a cross-point structure and increase a size of the cell array.

In an embodiment, an electronic device includes a semiconductor memory unit that comprises first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates $(-(k-n), 0)$, $(k-n, 0)$, $(0, k-n)$ and $(0, -(k-n))$ where k is a natural number and n is an integer in a range of 0 to (k−1).

Embodiments of the above device may include one or more of the following.

A cross-sectional shape and a planar shape of the variable resistance pattern are substantially the same as a cross-sectional shape and a planar shape of the insulating pattern, respectively. The insulating pattern further includes impurities which cause a loss of a variable resistance characteristic compared to the variable resistance pattern. The insulating pattern includes a metal oxide which satisfies a stoichiometric ratio, and the variable resistance pattern is deficient in oxygen compared to the insulating pattern. The semiconductor memory unit further comprises an insulating layer filled in a space between the insulating patterns and the variable resistance patterns, and the insulating patterns and the insulating layer include a same insulating material. The number of the first lines is (2k+1), and the number of the second lines is (2k+1). First variable resistance patterns of the variable resistance patterns serve as dummy memory cells, and the first variable resistance patterns are coupled to the first and second lines which are coupled to the insulating patterns located at the vertexes of the first to $(n+1)^{th}$ virtual lines. The number of the first lines is (2k+2), and the number of the second lines is (2k+2), and wherein the number of the central first line is 2, and the number of the central second line is 2. When n is equal to or greater than 1, first variable resistance patterns of the variable resistance patterns serve as dummy memory cells, and the first variable resistance patterns are coupled to the first and second lines which are coupled to the insulating patterns located at the vertexes of the first to $n^{th}$ virtual lines.

In another embodiment, an electronic device includes a semiconductor memory unit that comprises first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein the number of first insulating patterns of the insulating patterns is n, and the first insulating patterns are coupled to the first and second lines which are coupled to a selected variable resistance pattern of the variable resistance patterns where n is a natural number and constant.

Embodiments of the above device may include one or more of the following.

The number of second insulating patterns of the insulating patterns is different from n, and the second insulating patterns are coupled to the first and second lines which are coupled to first variable resistance patterns of the variable resistance patterns, and wherein the first variable resistance patterns serve as dummy memory cells. A cross-sectional shape and a planar shape of the variable resistance pattern are substantially the same as a cross-sectional shape and a planar shape of the insulating pattern, respectively. The insulating pattern further includes impurities which cause a loss of a variable resistance characteristic compared to the variable resistance pattern. The insulating pattern includes a metal oxide which satisfies a stoichiometric ratio, and the variable resistance pattern is deficient in oxygen compared to the insulating pattern. The semiconductor memory unit further comprises an insulating layer filled in a space between the insulating patterns and the variable resistance patterns, and the insulating patterns and the insulating layer include a same insulating material.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit is a part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit is a part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is a part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit is a part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit is a part of the memory or the buffer memory in the memory system.

In another embodiment, a method of manufacturing an electronic device comprising a semiconductor memory unit, comprises forming first lines over a substrate; forming variable resistance patterns over the first lines, the variable resistance patterns being located at intersections of the first lines and second lines crossing the first lines; forming insulating patterns by changing some variable resistance patterns of the variable resistance patterns into the insulating patterns; and forming the second lines over the variable resistance patterns and the insulating patterns, wherein, when a central intersection defined by a central first line of the first lines and a central second line of the second lines corresponds to a coordinate (0, 0), the insulating patterns are located on first to $(n+1)^{th}$ virtual lines, the $(n+1)^{th}$ virtual line having a polygonal shape in which vertexes correspond to coordinates $(-(k-n), 0)$, $(k-n, 0)$, $(0, k-n)$ and $(0, -(k-n))$ where k is a natural number and n is an integer in a range of 0 to $(k-1)$.

Embodiments of the above method may include one or more of the following.

The forming of the insulating patterns comprising: forming a mask pattern over a resultant structure including the variable resistance patterns, the mask pattern having an opening which exposes a region where the insulating patterns are to be formed; and doping impurities which cause a loss of a variable resistance characteristic into the variable resistance patterns exposed by the opening. The forming of the insulating patterns comprising: forming a mask pattern over a resultant structure including the variable resistance patterns, the mask pattern having an opening which exposes a region where the insulating patterns are to be formed; forming grooves by removing the variable resistance patterns exposed by the opening; and filling the grooves with an insulating material. A shape of the opening is similar to the first to $(n+1)^{th}$ virtual lines.

These and other aspects, implementations and associated advantages are described will become apparent in view of the drawings and the description of embodiments provided herein, which are intended to provide further explanation of the invention as claimed.

BRIEF DESCRIPTION OF THE DRAWINGS

FIGS. 3A and 3B are cross-sectional views illustrating an example of a method for fabricating the semiconductor device of FIGS. 2A and 2B.

DETAILED DESCRIPTION

Figure 1:
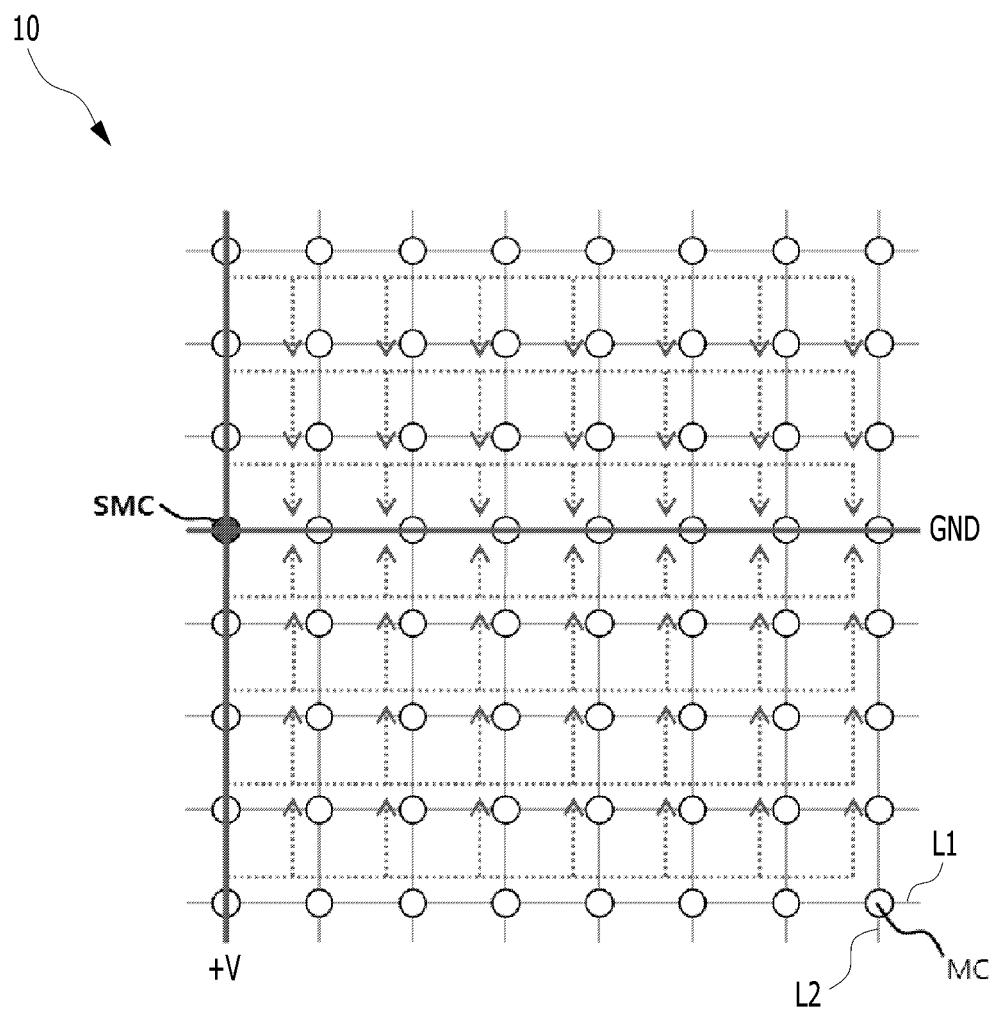
FIG. 1 is a plan view illustrating a semiconductor device in accordance with a comparative example and a problem thereof.

Various embodiments of the present disclosure will be described below with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description having two or more layers in a multi-layer structure, the relative positioning relationship of such layers or the sequence in which the layers are arranged reflects a particular implementation of an embodiment and a different relative positioning relationship or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers exist between the first layer and the second layer or the substrate.

Prior to describing implementations, a semiconductor device in accordance with a comparative example and a problem thereof will be described with reference to FIG. 1.

FIG. 1 is a plan view illustrating a semiconductor device 10 in accordance with a comparative example and a problem thereof.

Referring to FIG. 1, the semiconductor device 10 may have a cross-point cell array structure which includes a plurality of first lines L1, a plurality of second lines L2, and a plurality of memory cells MC. The first lines L1 may extend in a first direction and in parallel to each other. The second lines L2 may be disposed over the first lines L1 and extend in a second direction crossing the first direction and in parallel with each other. The memory cells MC are defined at intersections of the first lines L1 and the second lines L2 and disposed between the first lines L1 and the second lines L2.

The memory cells MC may include a variable resistance material which switches between different resistance states depending on a voltage or current supplied thereto through the first lines L1 and the second lines L2. The memory cell MC may store one bit of data. For example, the memory cell MC may store data '0' when the variable resistance material is in a low resistance state, and the memory cell MC may store data '1' when the variable resistance material is in a high resistance state.

In this cross-point cell array structure, a required operation voltage may be applied to a selected memory cell SMC through corresponding first and second lines L1 and L2 coupled to the selected memory cell SMC in order to perform a write operation or a read operation to the selected memory cell SMC. For example, a ground voltage GND may be applied to a selected one of the first lines L1, and a certain voltage +V may be applied to a selected one of the second lines L2. However, since the memory cells MC share the first lines L1 and/or the second lines L2 so as to be coupled to each other as a whole, a sneak current may flow into unselected memory cells (indicated in FIG. 1 by dotted arrows).

When the sneak current is large, an operating characteristic of the semiconductor device 10 may be deteriorated. For example, a sensing margin may be reduced. Also, when the sneak current is large, it is difficult to increase the number of lines and memory cells. As a result, a size of a cell array cannot be increased. Implementations of the present disclosure provide a semiconductor device in which an amount of a sneak current is reduced and controlled to be uniform, and processes for fabricating the same.

Figure 2A:
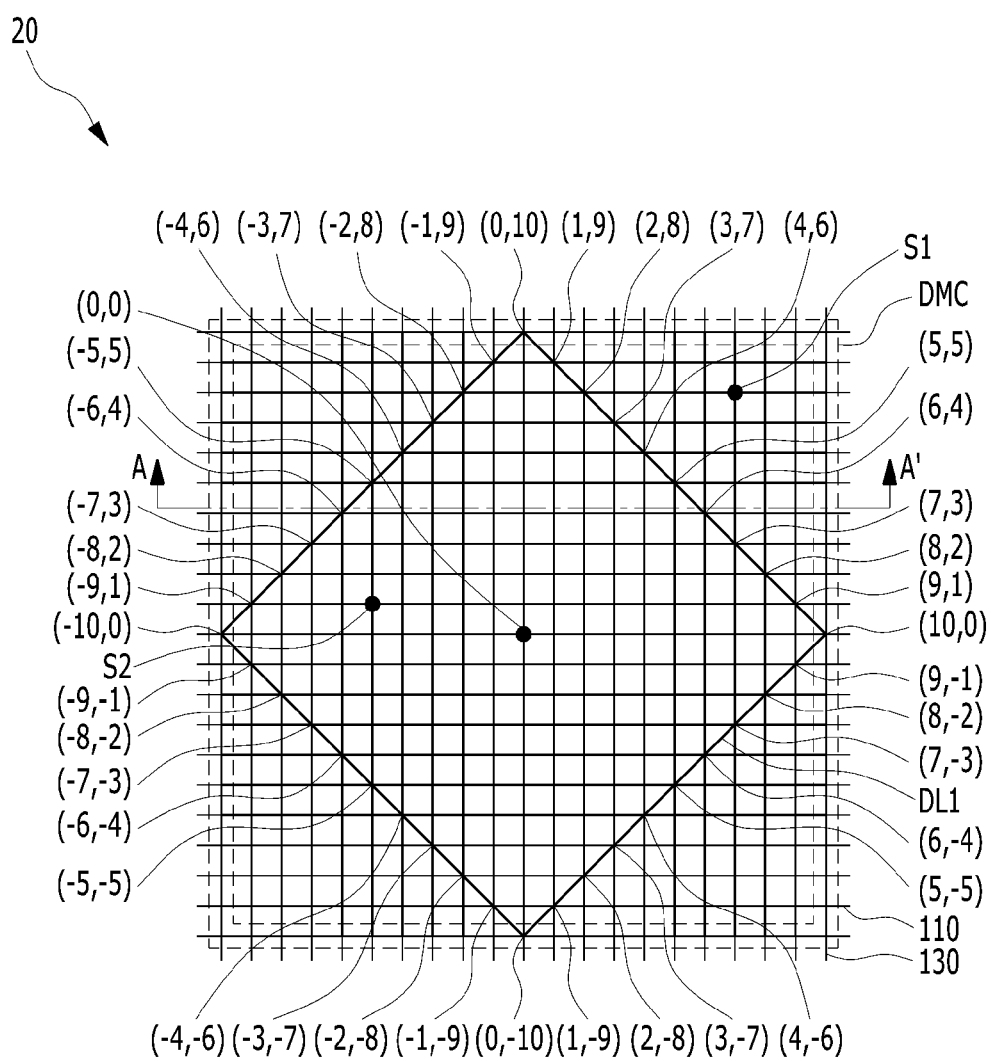
FIG. 2A is a plan view illustrating a semiconductor device in accordance with an implementation.
Figure 2B:
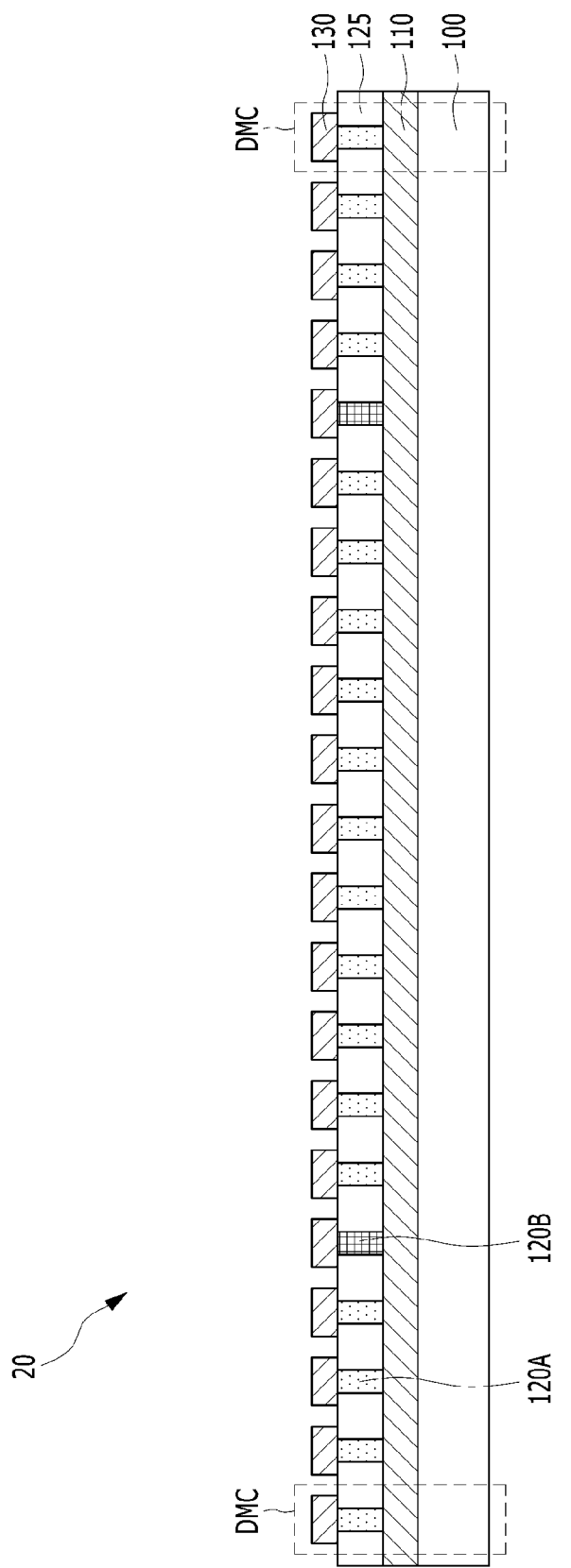
FIG. 2B is a cross-sectional view taken along a line A-A' of FIG. 2A.

FIG. 2A is a plan view illustrating a portion of a semiconductor device 20 in accordance with an implementation, and FIG. 2B is a cross-sectional view taken along a line A-A' of FIG. 2A.

Referring to FIGS. 2A and 2B, the semiconductor device 20 may include a substrate 100, a plurality of first lines 110 disposed over the substrate 100, a plurality of second lines 130 disposed over the first lines 110, and a plurality of patterns 120A and 120B interposed between the first lines 110 and the second lines 130. The first lines 110 may extend in a first direction which is parallel to a surface of the substrate 100. The second lines 130 may extend in a second direction which is parallel to the surface of the substrate 100 and crosses the first direction. The patterns 120A and 120B may be disposed at intersections of the first lines 110 and the second lines 130. A space between the patterns 120A and 120B may be filled with an insulating layer 125. Here, the patterns 120A and 120B may include variable resistance patterns 120A and insulating patterns 120B.

The substrate 100 may include additional elements (not shown), for example, an access element for controlling the first lines 110 and/or the second lines 130.

The first lines 110 and the second lines 130 may supply a voltage or current to the variable resistance patterns 120A. The first lines 110 and the second lines 130 may be formed of one or more conductive materials, e.g., a metal, a metal nitride, a semiconductor material doped with an impurity, or a combination thereof. As shown in FIG. 2A, the number of the first lines 110 may be odd, for example, 21, and the number of the second lines 130 may be odd, for example, 21. That is, the number of the first lines 110 may be same as the number of the second lines 130. Therefore, 21*21 intersections may be defined by the first lines 110 and the second lines 130.

The variable resistance pattern 120A may have a characteristic which switches between different resistance states depending on a voltage or current applied thereto. Therefore, the variable resistance pattern 120A may serve as a memory cell storing different data. For example, the variable resistance pattern 120A may have a single-layered structure or a multi-layered structure including an oxygen-deficient metal oxide containing a large amount of oxygen vacancies. The oxygen-deficient metal oxide may include a material that is deficient in oxygen compared to a material that satisfies a stoichiometric ratio. The oxygen-deficient metal oxide may include a titanium oxide $TiO_x$, where x is smaller than 2, or a tantalum oxide $TaO_y$, where y is smaller than 2.5. In this case, a resistance state of the variable resistance pattern 120A may be changed by a movement of the oxygen vacancies. That is, when a filament current path is created by the movement of the oxygen vacancies in the variable resistance pattern 120A, the variable resistance pattern 120A may be in a low resistance state and store data '0'. On the other hand, when the filament current path is dismantled by the movement of the oxygen vacancies, the variable resistance pattern 120A may be in a high resistance state and store data '1'. However, other implementations are also possible. In an implementation, the variable resistance pattern 120A may have a single-layered structure or a multi-layered structure including one of various variable resistance materials that are used in an RRAM, a PRAM, an FRAM, an MRAM, etc. The variable resistance materials may include a metal oxide such as a transition metal oxide or a perovskite-based material, a phase change material such as a chalcogenide-based material, a ferroelectric material, a ferromagnetic material, etc. The variable resistance pattern 120A may overlap with each of intersection regions of the first lines 110 and the second lines 130, and have an island shape separated from an adjacent variable resistance pattern 120A.

The insulating pattern 120B may have an insulating characteristic. Therefore, a current flow through the insulating pattern 120B cannot occur in spite of a voltage or current supplied through the first lines 110 and the second lines 130. That is, the insulating pattern 120B may block a current flow between the first lines 110 and the second lines 130. The insulating pattern 120B may be formed of any of various insulating materials depending on processes for forming the insulating pattern 120B. This will be described later in more detail. The insulating pattern 120B may be formed by removing the variable resistance pattern 120A or by changing material characteristics of the variable resistance pattern 120A. Therefore, the insulating pattern 120B may have plan and cross-sectional shapes substantially the same as those of the variable resistance pattern 120A.

The insulating layer 125 may be formed of one or more insulating materials, e.g., a silicon oxide, a silicon nitride or a combination thereof.

Here, the insulating patterns 120B may be located at some intersections of the intersections of the first lines 110 and the second lines 130, and the variable resistance patterns 120A may be located at the other intersections of the intersections of the first lines 110 and the second lines 130. Hereinafter, the some intersections and the other intersections may be referred to as first intersections and second intersections, respectively. For convenience of description, each of the intersections may be represented by a corresponding coordinate, wherein a unit change in a first and a second component of the coordinate correspond to a distance between adjacent first lines and adjacent second lines, respectively. The first intersections may be arranged to have a certain shape. The arrangement of the first intersections may be described in more detail as follows.

Referring to FIG. 2A, a central intersection may correspond to a coordinate (0, 0). Here, the central intersection may be defined by a central one of the first lines 110 and a central one of the second lines 130. The central one of the first lines 110 is located at the center of the first lines 110, that is, an eleventh one of the first lines 110. The central one of the second lines 130 is located at the center of the second lines 130, that is, an eleventh one of the second lines 130. In this case, intersections located at both ends of the central one of the first lines 110 may correspond to coordinates (−10, 0) and (10, 0). Also, intersections located at both ends of the central one of the second lines 130 may correspond to coordinates (0, 10) and (0, −10). Assuming there is a virtual line DL1 having a tetragonal shape and vertexes of the virtual line DL1 correspond to coordinates (−10, 0), (10, 0), (0, 10) and (0, −10), the insulating patterns 120B may be located at intersections which are located on the virtual line DL1. That is, as shown FIG. 2A, the insulating patterns 120B may be located at intersections represented by coordinates given in the figure, other than the coordinate (0,0). The variable resistance patterns 120A may be located at remaining intersections.

By arranging the insulating patterns 120B as shown in FIG. 2A, following advantages may be obtained.

First, since the insulating patterns 120B are located on a sneak current path to block the sneak current, an amount of the sneak current may be reduced.

Furthermore, the amount of the sneak current may be uniform regardless of which of the variable resistance patterns 120A is selected. This is because the number of the insulating patterns 120B sharing the first and second lines 110 and 130 with a selected one of the variable resistance patterns 120A is constant, regardless of a position of the selected one of the variable resistance patterns 120A. For example, the variable resistance pattern 120A located at an intersection S1 may be referred to as a first memory cell and the variable resistance pattern 120A located at an intersection S2 may be referred to as a second memory cell. When the first memory cell at the intersection S1 is selected, the number of the insulating patterns 120B coupled to the first line 110 coupled to the first memory cell is 2 and the number of the insulating patterns 120B coupled to the second line 130 coupled to the first memory cell is 2. FIG. 2A shows that the first and second lines 110 and 130 coupled to the first memory cell and the virtual line DL1 meet at four points. Also, when the second memory cell at the intersection S2 is selected, then like the above case wherein the first memory cell was selected, the number of the insulating patterns 120B coupled to the first line 110 coupled to the second memory cell is 2 and the number of the insulating patterns 120B coupled to the second line 130 coupled to the second memory cell is 2. Similarly, when another memory cell, for example, a memory cell corresponding to the coordinate (0, 0) is selected, the number of the insulating patterns 120B sharing the first and second lines 110 and 130 with a selected memory cell is 4.

Since the amount of the sneak current is reduced and uniform, an operating characteristic of the semiconductor device may be improved and a size of a cell array may be increased.

However, when one of outermost memory cells which are located in an outermost region DMC surrounded by a dotted line is selected, the number of the insulating patterns 120B sharing the first and second lines 110 and 130 with a selected memory cell may be 2 or 3. That is, when the selected memory cell is in the outermost region DMC, the number of the insulating patterns 120B sharing the first and second lines 110 and 130 with the selected memory cell may differ according to a position of the selected memory cell. Therefore, if one of the outermost memory cells is selected, the amount of the sneak current may not be uniform. To solve this problem, the outermost memory cells may serve as dummy memory cells. The outermost memory cells may include the variable resistance patterns 120A which share the second lines 130 with the insulating patterns 120B located at the vertexes on a X-axis of the virtual line DL1, that is, the intersections corresponding to the coordinates (−10, 0) and (10, 0). The outermost memory cells may further include the variable resistance patterns 120A which share the first lines 110 with the insulating patterns 120B located at the vertexes on a Y-axis of the virtual line DL1, that is, the intersections corresponding to the coordinates (0, 10) and (0, −10).

Although not shown, the semiconductor device 20 may further include one or more first dummy lines which are disposed at a side of the first lines 110 to be parallel to the first lines 110, or, one or more second dummy lines which are disposed at a side of the second lines 130 to be parallel to the second lines 130.

An example of a method for fabricating the above semiconductor device will be described with reference to FIGS. 3A to 3C.

Figure 3A:
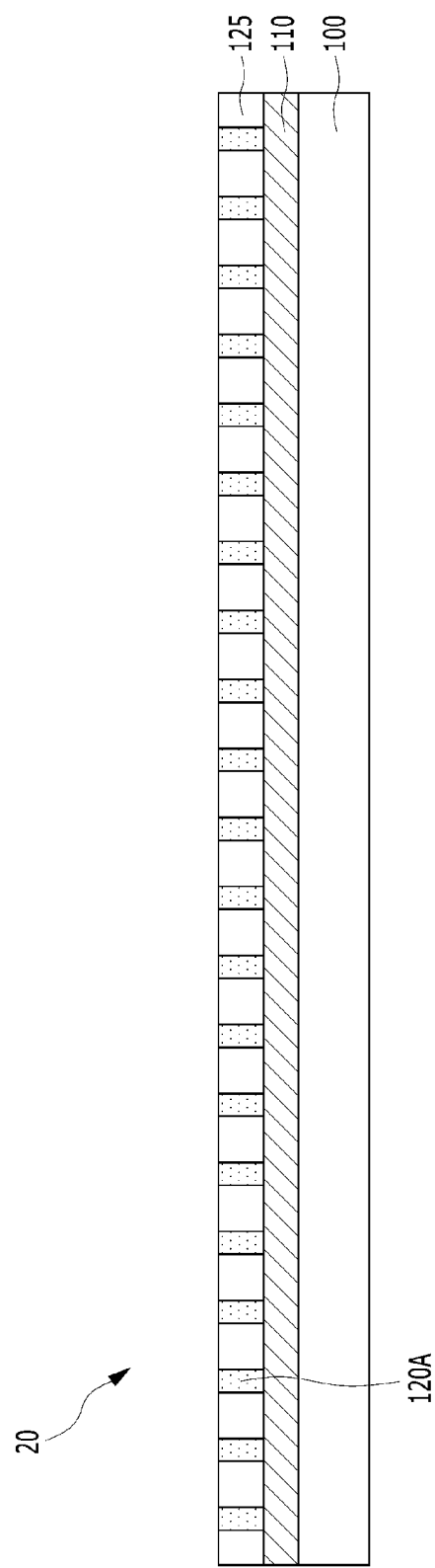
Figure 3C:
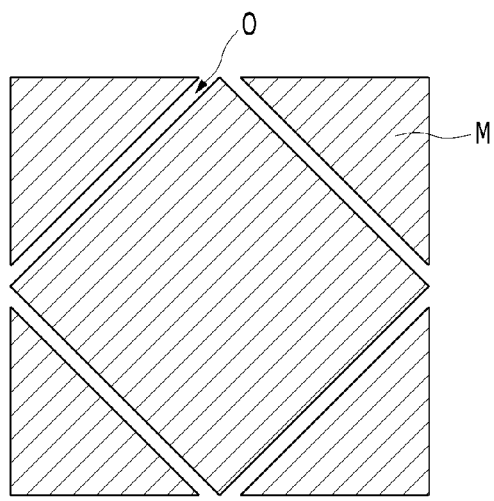
FIG. 3C is a plan view illustrating an example of a mask pattern of FIG. 3B.

FIGS. 3A and 3B are cross-sectional views illustrating an example of a method for fabricating the semiconductor device 20 of FIGS. 2A and 2B, and FIG. 3C is a plan view illustrating an example of a mask pattern of FIG. 3B.

Referring to FIG. 3A, the first lines 110 extending in the first direction and a first insulating layer (not shown) filled in a space between the first lines 110 may be formed over the substrate 100. In an implementation, the first lines 110 and the first insulating layer may be formed by depositing a conductive material over the substrate 100, selectively etching the conductive material to form the first lines 110, forming an insulating material filling the space between the first lines 110 and covering the first lines 110, and performing a planarization process until top surfaces of the first lines 110 are exposed to form the first insulating layer. In another implementation, the first lines 110 and the first insulating layer may be formed by depositing an insulating material over the substrate 100, selectively etching the insulating material to form the first insulating layer having trenches, forming a conductive material covering the first insulating layer having the trenches, and performing a planarization process until a top surface of the first insulating layer is exposed to form the first lines 110 filled in the trenches.

Then, the variable resistance patterns 120A and a second insulating layer 125 may be formed over the first lines 110 and the first insulating layer. The variable resistance patterns 120A may be coupled to the first lines 110 and arranged in a matrix configuration along the first and second directions to be located at the intersections of the first lines 110 and the subsequently-formed second lines 130 shown in FIG. 2B. The second insulating layer 125 may be formed in a space between the variable resistance patterns 120A. In an implementation, the variable resistance patterns 120A and the second insulating layer 125 may be formed by depositing a variable resistance material over the first lines 110 and the first insulating layer, selectively etching the variable resistance material to form the variable resistance patterns 120A, forming an insulating material filling the space between the variable resistance patterns 120A and covering the variable resistance patterns 120A, and performing a planarization process until top surfaces of the variable resistance patterns 120A are exposed to form the second insulating layer 125. In this implementation, the variable resistance patterns 120A may have a shape of which a width increases from top to bottom. In another implementation, the variable resistance patterns 120A and the insulating layer 125 may be formed by depositing an insulating material over the first lines 110 and the first insulating layer, selectively etching the insulating material to form the second insulating layer 125 having holes, forming a variable resistance material covering the second insulating layer 125 having the holes, and performing a planarization process until a top surface of the second insulating layer 125 is exposed to form the variable resistance patterns 120A filled in the holes. In this implementation, the variable resistance patterns 120A may have a shape of which a width decreases from top to bottom.

Referring to FIG. 3B, a mask pattern M may be formed over the variable resistance patterns 120A and the second insulating layer 125. The mask pattern M may have an opening O which exposes a region where the insulating patterns 120B are to be formed. Then, the variable resistance patterns 120A exposed by the opening O may be changed into the insulating patterns 120B.

In an implementation, the insulating patterns 120B may be formed by doping impurities into the variable resistance patterns 120A exposed by the opening O (see arrow). The doping process may be performed by an ion implantation. Here, the impurities may cause a loss of a variable resistance characteristic of the variable resistance patterns 120A so that the variable resistance patterns 120A have an insulating characteristic. The insulating patterns 120B obtained by this doping process may be formed of a same material as the variable resistance patterns 120A while further including the impurities which cause the loss of the variable resistance characteristic. For example, when the variable resistance patterns 120A include an oxygen-deficient metal oxide layer, the impurities may include oxygen. When the oxygen is doped into the oxygen-deficient metal oxide layer, oxygen vacancies of the oxygen-deficient metal oxide layer may be reduced so that the variable resistance characteristic of the oxygen-deficient metal oxide layer may be lost. As a result, the insulating patterns 120B may include an oxygen-rich metal oxide layer which contains more oxygen compared to the variable resistance patterns 120A. The oxygen-rich metal oxide layer may be a layer which satisfies a stoichiometric ratio, e.g., a titanium dioxide $TiO_2$ layer, a tantalum pentoxide $Ta_2O_5$ layer, etc.

In another implementation, the insulating patterns 120B may be formed by removing the variable resistance patterns 120A exposed by the opening O using an wet etching process or a dry etching process, and filling grooves formed by the removal of the variable resistance patterns 120A with an insulating material. In this implementation, any insulating material may be used for the insulating patterns 120B. For example, the insulating patterns 120B may be formed of a same material as the second insulating layer 125, e.g., a silicon oxide, a silicon nitride, or a combination thereof. That is, the insulating patterns 120B obtained by this process may include an insulating material different and not derived from materials included in the variable resistance patterns 120A.

In any case, the insulating patterns 120B may be substituted for the variable resistance patterns 120A in the region exposed by the opening O. Therefore, a cross-sectional shape and a plan shape of the insulating patterns 120B may be substantially the same as a cross-sectional shape and a plan shape of the variable resistance patterns 120A, respectively.

An example of a plan shape of the mask pattern M is shown in FIG. 3C. Referring to FIG. 3C, the opening O does not have an island shape which exposes each of the insulating patterns 120B, but the opening O has a shape similar to a tetragonal shape which connects the insulating patterns 120B with each other (see DL1 of FIG. 2A). In this implementation, a process for forming the mask pattern M may be facilitated. Moreover, when two or more virtual lines exist, the opening may have a shape similar to the virtual lines while exposing all of the virtual lines.

Then, referring back to FIG. 2B, after forming the insulating patterns 120B, the mask pattern M is removed, and then, the second lines 130 extending in the second direction and a third insulating layer (not shown) filled in a space between the second lines 130 may be formed over a resultant structure. Processes for forming the second lines 130 and the third insulating layer between the second lines 130 may be substantially the same as processes for forming the first lines 110 and the first insulating layer between the first lines 110.

In the above implementation, the insulating patterns 120B are located at the intersections overlapping with one virtual line DL1. However, other implementations are also possible. In another implementation, the insulating patterns 120B may be located at intersections overlapping with two or more virtual lines. This will be described with reference to FIGS. 4 and 5.

Figure 4:
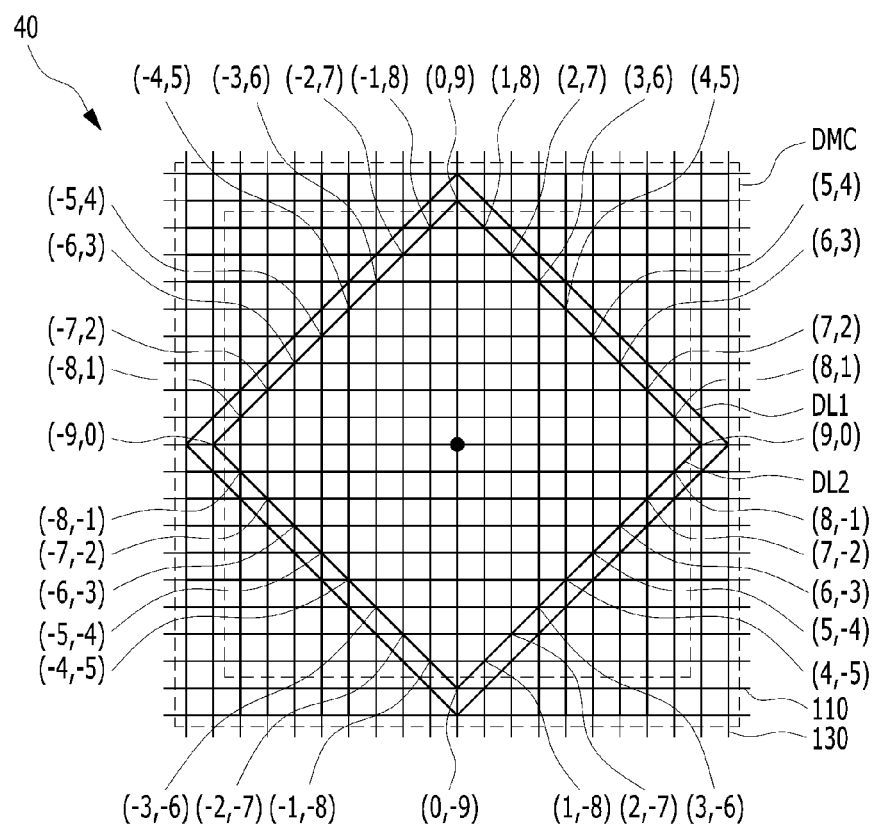
FIG. 4 is a plan view illustrating a semiconductor device in accordance with another implementation.

FIG. 4 is a plan view illustrating a semiconductor device 40 in accordance with another implementation. Specifically, FIG. 4 shows an implementation wherein insulating patterns are located on two virtual lines, each virtual line having a polygonal shape. Differences from the above implementation of FIG. 2A will be mainly described.

Referring to FIG. 4, variable resistance patterns or insulating patterns may be formed at intersections of the first lines 110 and the second lines 130.

Here, the insulating patterns may be located at the intersections which are located on a first virtual line DL1 and a second virtual line DL2 located inside the region delimited by the first virtual line DL1. The first virtual line DL1 may be substantially the same as the virtual line DL1 of FIG. 2A. That is, the first virtual line DL1 may be a tetragonal line in which vertexes are located at four intersections corresponding to the coordinates (−10, 0), (10, 0), (0, 10) and (0, −10). The second virtual line DL2 may be a tetragonal line in which vertexes are located at four intersections corresponding to coordinates (−9, 0), (9, 0), (0, 9) and (0, −9). The coordinates of the intersections on the first virtual line DL1 may be substantially the same as shown in FIG. 2A. Therefore, in FIG. 4, only the coordinates of the intersections on the second virtual line DL2 are shown.

In this case, even when any memory cell other than one of the outermost memory cells described below is selected, the number of the insulating patterns sharing the first and second lines 110 and 130 with a selected memory cell is 4 and constant. Therefore, an amount of a sneak current may be uniform. Furthermore, since the number of the insulating patterns located on a sneak current path is increased, the amount of the sneak current may be further reduced.

However, when one of the outermost memory cells which are located in an outermost region DMC surrounded by a dotted line is selected, the number of the insulating patterns sharing the first and second lines 110 and 130 with the selected memory cell may not be constant. Therefore, the outermost memory cells may serve as dummy memory cells. In this implementation, the outermost memory cells may include the variable resistance patterns which share one or more of the first and second lines 110 and 130 with the insulating patterns located at the vertexes of the first virtual line DL1, and may further include the variable resistance patterns which share one or more of the first and second lines 110 and 130 with the insulating patterns located at the vertexes of the second virtual line DL2.

Figure 5:
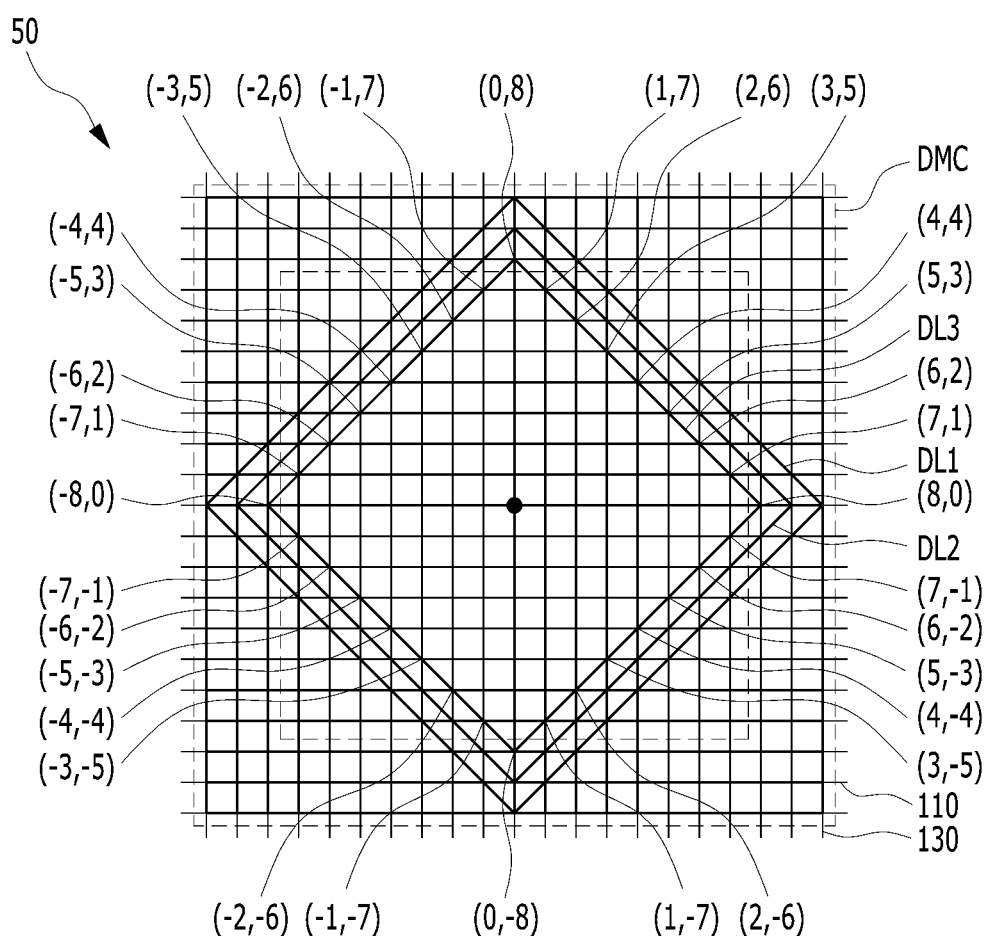
FIG. 5 is a plan view illustrating a semiconductor device in accordance with another implementation.

FIG. 5 is a plan view illustrating a semiconductor device 50 in accordance with another implementation. Specifically, FIG. 5 shows an implementation wherein insulating patterns are located on three virtual lines. Differences from the above implementations will be mainly described.

Referring to FIG. 5, variable resistance patterns or insulating patterns may be formed at intersections of the first lines 110 and the second lines 130.

Here, the insulating patterns may be located at the intersections which are located on a first virtual line DL1, a second virtual line DL2 being inside the first virtual line DL1, and a third virtual line DL3 being inside the second virtual line DL2. The first and second virtual lines DL1 and DL2 may be substantially the same as the first and second virtual lines DL1 and DL2 of FIG. 4. The third virtual line DL3 may be a tetragonal line in which vertexes are located at four intersections corresponding to coordinates (−8, 0), (8, 0), (0, 8) and (0, −8). The coordinates of the intersections on the first virtual line DL1 may be substantially the same as shown in FIG. 2A, and the coordinates of the intersections on the second virtual line DL2 may be substantially the same as shown in FIG. 4. Therefore, in FIG. 5, only the coordinates of the intersections on the third virtual line DL3 are shown.

In this implementation, even when any memory cell is selected except for outermost memory cells, the number of the insulating patterns sharing the first and second lines 110 and 130 with a selected memory cell is 6 and constant. Therefore, an amount of a sneak current may be uniform. Furthermore, since the number of the insulating patterns located on a sneak current path is increased, the amount of the sneak current may be further reduced.

However, when one of the outermost memory cells which are located in an outermost region DMC surrounded by a dotted line is selected, the number of the insulating patterns sharing the first and second lines 110 and 130 with the selected memory cell may not be constant. Therefore, the outermost memory cells may serve as dummy memory cells. In this implementation, the outermost memory cells may include the variable resistance patterns located outside the region delimited by the first virtual line DL1 which share one or more of the first and second lines 110 and 130 with one or more of the insulating patterns located at the vertexes of the first to third virtual lines DL1, DL2 and DL3.

From the above implementations of FIGS. 2A, 4 and 5, following rules may be derived with respect to the arrangement of the insulating patterns.

When each of the number of the first lines 110 and the number of the second lines 130 is (2k+1) where k is a natural number and a central intersection defined by a central one of the first lines 110 and a central one of the second lines 130 corresponds to a coordinate (0, 0), intersections located at both ends of the central one of the first lines 110 may correspond to coordinates (−k, 0) and (k, 0), and intersections located at both ends of the central one of the second lines 130 may correspond to coordinates (0, k) and (0, −k).

The insulating patterns may be located at intersections overlapping with at least the first virtual line DL1 which has a tetragonal shape and vertexes corresponding to the coordinates (−k, 0), (k, 0), (0, k) and (0, −k). The insulating patterns may be further located at intersections overlapping with one or more virtual lines which have a tetragonal shape and are located inside the region delimited by the first virtual line DL1. That is, the insulating patterns may be located at intersections on first to $(n+1)^{th}$ virtual lines. Here, the $(n+1)^{th}$ virtual line has a tetragonal shape in which vertexes correspond to coordinates (−(k−n), 0), (k−n, 0), (0, k−n) and (0, −(k−n)), where n is an integer in a range of 0 to (k−1).

Outermost memory cells which serve as dummy memory cells may include variable resistance patterns located outside the region delimited by the first virtual line DL1 which share one or more of the first and second lines 110 and 130 with one or more of the insulating patterns located at the vertexes of the first to $(n+1)^{th}$ virtual lines.

In the above implementations of FIGS. 2A to 5, each of the number of the first lines 110 and the number of the second lines 130 is odd. However, in other implementations, each of the number of the first lines 110 and the number of the second lines 130 may be even. This will be described with reference to FIGS. 6 to 8.

Figure 6:
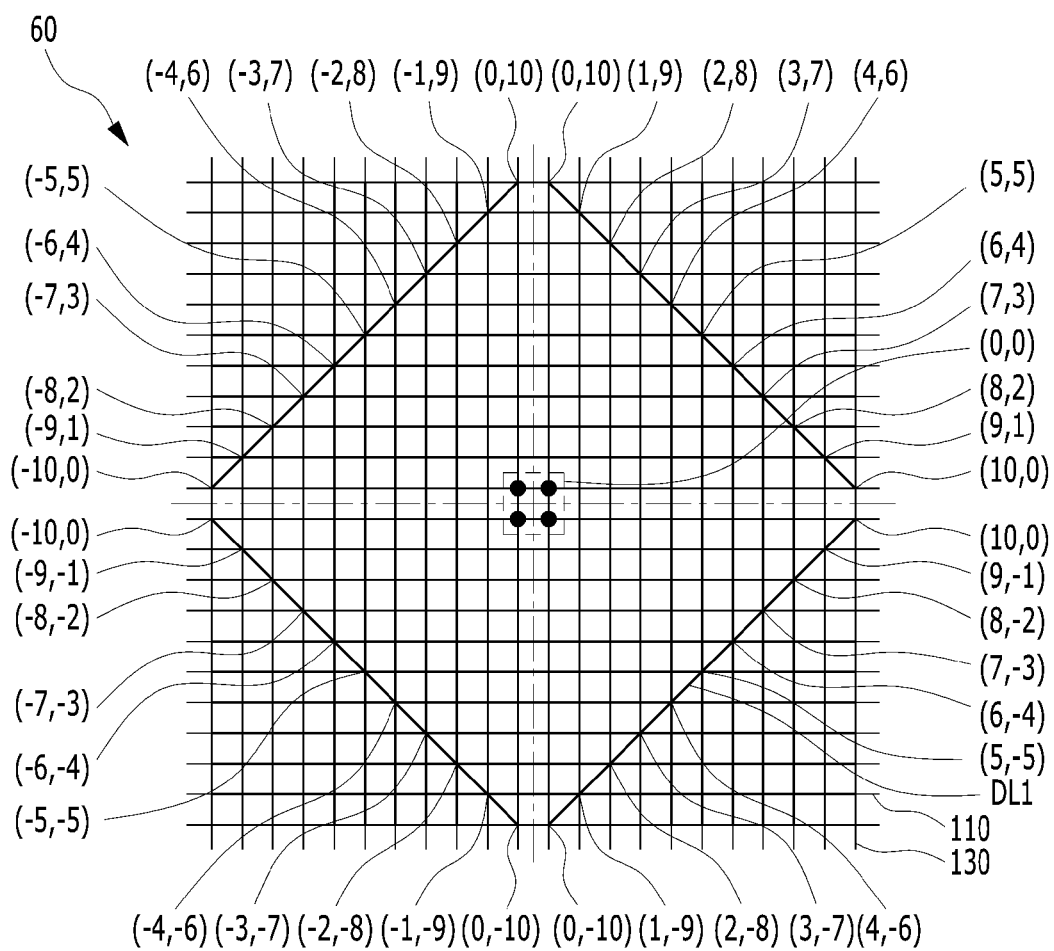
FIG. 6 is a plan view illustrating a semiconductor device in accordance with another implementation.

FIG. 6 is a plan view illustrating a semiconductor device 60 in accordance with another implementation. Differences from the above implementation of FIG. 2A will be mainly described.

Referring to FIG. 6, the number of the first lines 110 may be even, for example, 22, and the number of the second lines 130 may be even, for example, 22. Therefore, 22*22 intersections may be defined by the first lines 110 and the second lines 130. As described above, variable resistance patterns may be located at some intersections, and insulating patterns may be located at other intersections. Here, an arrangement of the insulating patterns will be described in more detail as follows.

Unlike the above implementations of FIGS. 2A, 4, and 5, since each of the number of the first lines 110 and the number of the second lines 130 is even, there may not be one of the first lines 110 which is located at the center of the first lines 110, and there may not be one of the second lines 130 which is located at the center of the second lines 130. Therefore, in this implementation, two of the first lines 110 which are eleventh from top and bottom may be referred to as central ones of the first lines 110, and two of the second lines 130 which are eleventh from left and right may be referred to as central ones of the second lines 130. Four central intersections may be defined by the two central ones of the first lines 110 and the two central ones of the second lines 130. The four central intersections may correspond to a coordinate (0, 0), two intersections located at right ends of the central ones of the first lines 110 may correspond to a coordinate (10, 0), two intersections located at left ends of the central ones of the first lines 110 may correspond to a coordinate (−10, 0), two intersections located at top ends of the central ones of the second lines 130 may correspond to a coordinate (0, 10), and two intersections located at bottom ends of the central ones of the second lines 130 may correspond to a coordinate (0, −10). Assuming there is a virtual line DL1 having an octagonal shape and the eight intersections corresponding to the coordinates (−10, 0), (10, 0), (0, 10) and (0, −10) are vertexes of the virtual line DL1, the insulating patterns may be located at intersections which are located on the virtual line DL1. That is, as shown FIG. 6, the insulating patterns may be located at intersections represented by the shown coordinates other than (0,0). The variable resistance patterns may be located at remaining intersections Here, even when any memory cell is selected, the number of the insulating patterns sharing each of the first and second lines 110 and 130 with a selected memory cell is 2 and constant. In this implementation, although one of outermost memory cells located outside the region delimited by the virtual line DL1 and which share one or more of the first and second lines 110 and 130 with one or more of the insulating patterns located at the vertexes of the virtual line DL1 is selected, the number of the insulating patterns sharing each of the first and second lines 110 and 130 with the selected memory cell may be constant. For example, when a memory cell corresponding to a coordinate (10, 5) is selected, the number of the insulating patterns sharing each of the first and second lines 110 and 130 with this memory cell is 2. Therefore, in this implementation, the outermost memory cells may not be used as dummy memory cells.

By this implementation, an amount of a sneak current may be reduced and uniform.

In the implementation of FIG. 6, the insulating patterns 120B are located at the intersections overlapping with one virtual line DL1. However, other implementations are also possible. For example, the insulating patterns may be located at intersections overlapping with two or more virtual lines. This will be described with reference to FIGS. 7 and 8.

Figure 7:
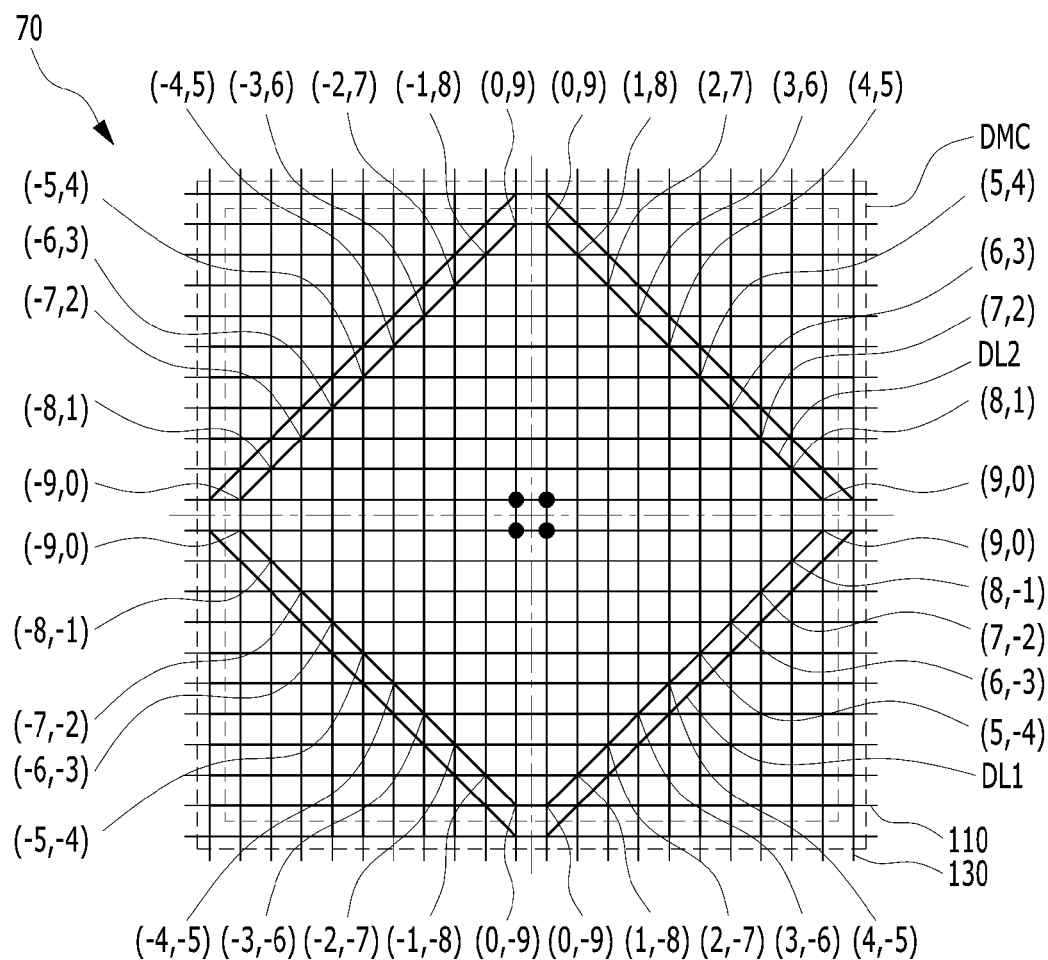
FIG. 7 is a plan view illustrating a semiconductor device in accordance with another implementation.

FIG. 7 is a plan view illustrating a semiconductor device 70 in accordance with another implementation. Specifically, FIG. 7 shows an implementation in which insulating patterns are located on two virtual lines.

Referring to FIG. 7, variable resistance patterns or insulating patterns may be formed at intersections of the first lines 110 and the second lines 130.

Here, the insulating patterns may be located at the intersections which are located on a first virtual line DL1 and a second virtual line DL2 located inside the region delimited by the first virtual line DL1. The first virtual line DL1 may be substantially the same as the virtual line DL1 of FIG. 6. The second virtual line DL2 may be an octagonal line in which vertexes are located at eight intersections corresponding to coordinates (−9, 0), (9, 0), (0, 9) and (0, −9). In FIG. 7, only the coordinates of the intersections on the second virtual line DL2 are shown.

In this implementation, even when any memory cell is selected except for outermost memory cells, the number of the insulating patterns sharing each of the first and second lines 110 and 130 with a selected memory cell is 4 and constant.

However, when one of the outermost memory cells which are located in an outermost region DMC surrounded by a dotted line is selected, the number of the insulating patterns sharing each of the first and second lines 110 and 130 with the selected memory cell may not be constant. Therefore, the outermost memory cells may serve as dummy memory cells. In this implementation, the outermost memory cells may include the variable resistance patterns located outside the region delimited by the first virtual line DL1 which share one or more of the first and second lines 110 and 130 with one or more of the insulating patterns located at the vertexes of the first virtual line DL1.

Figure 8:
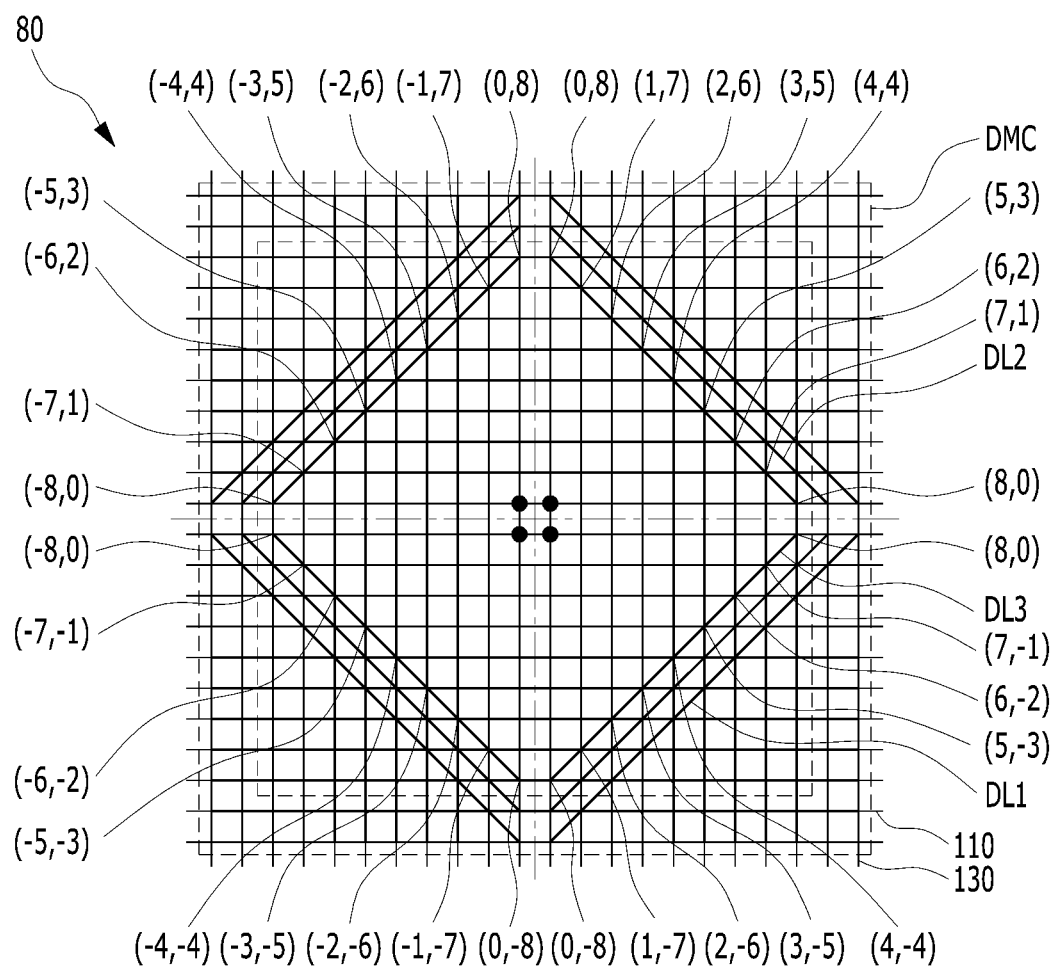
FIG. 8 is a plan view illustrating a semiconductor device in accordance with another implementation.

FIG. 8 is a plan view illustrating a semiconductor device 80 in accordance with another implementation. Specifically, FIG. 8 shows an implementation wherein insulating patterns are located on three virtual lines.

Referring to FIG. 8, variable resistance patterns or insulating patterns may be formed at intersections of the first lines 110 and the second lines 130.

Here, the insulating patterns may be located at the intersections which are located on a first virtual line DL1, a second virtual line DL2 located inside the region delimited by the first virtual line DL1, and a third virtual line DL3 located inside the region delimited by the second virtual line DL2. The first and second virtual lines DL1 and DL2 may be substantially the same as the first and second virtual lines DL1 and DL2 of FIG. 7. The third virtual line DL3 may be an octagonal line in which vertexes are located at eight intersections corresponding to coordinates (−8, 0), (8, 0), (0, 8) and (0, −8). In FIG. 8, only the coordinates of the intersections on the third virtual line DL3 are shown.

In this implementation, even when any memory cell is selected except for outermost memory cells, the number of the insulating patterns sharing each of the first and second lines 110 and 130 with a selected memory cell is 6 and constant.

However, when one of the outermost memory cells which are located in an outermost region DMC surrounded by a dotted line is selected, the number of the insulating patterns sharing each of the first and second lines 110 and 130 with the selected memory cell may not be constant. Therefore, the outermost memory cells may serve as dummy memory cells.

In this implementation, the outermost memory cells may include the variable resistance patterns located outside the region delimited by the first virtual line DL1 and which share one or more of the first and second lines 110 and 130 with one or more of the insulating patterns located at the vertexes of the first and second virtual lines DL1 and DL2.

From the above implementations of FIGS. 6 to 8, following rules may be derived with respect to the arrangement of the insulating patterns.

When each of the number of the first lines 110 and the number of the second lines 130 is (2k+2) where k is a natural number and four central intersections defined by two central ones of the first lines 110 and two central ones of the second lines 130 correspond to a coordinate (0, 0), two intersections located at right ends of the two central ones of the first lines 110 may correspond to a coordinate (k, 0), two intersections located at left ends of the two central ones of the first lines 110 may correspond to a coordinate (−k, 0), two intersections located at top ends of the two central ones of the second lines 130 may correspond to a coordinate (0, k), and two intersections located at bottom ends of the two central ones of the second lines 130 may correspond to a coordinate (0, −k).

The insulating patterns may be located at intersections overlapping with at least the first virtual line DL1 which has an octagonal shape and vertexes corresponding to the coordinates (−k, 0), (k, 0), (0, k) and (0, −k). Moreover, the insulating patterns may be further located at intersections overlapping with one or more virtual lines which have an octagonal shape and are inside the first virtual line DL1. That is, the insulating patterns may be located at intersections on first to $(n+1)^{th}$ virtual lines. Here, the $(n+1)^{th}$ virtual line has an octagonal shape in which vertexes correspond to coordinates (−(k−n), 0), (k−n, 0), (0, k−n) and (0, −(k−n)), where n is an integer in a range of 0 to (k−1).

When there is only the first virtual line DL1, outermost memory cells may not serve as dummy memory cells. That is, the outermost memory cells serve as memory cells like other variable resistance patterns. On the other hand, when there are two or more virtual lines, outermost memory cells which serve as dummy memory cells may include variable resistance patterns located outside the region delimited by the first virtual line DL1 and which share one or more of the first and second lines 110 and 130 with one or more of the insulating patterns located at the vertexes of the first to $n^{th}$ virtual lines.

However, the arrangement of the insulating patterns may not be limited to the above implementations of FIGS. 2A to 8. The arrangement of the insulating patterns may be changed in various ways as long as the number of the insulating patterns which share the first and second lines with a selected variable resistance patterns is constant regardless of which variable resistance pattern, other than dummy memory cells, is selected.

The above and other memory circuits or semiconductor devices based on the disclosed technology can be used in a range of devices or systems. FIGS. 9-13 provide some examples of devices or systems that can implement a memory circuit in accordance with an embodiment disclosed herein.

Figure 9:
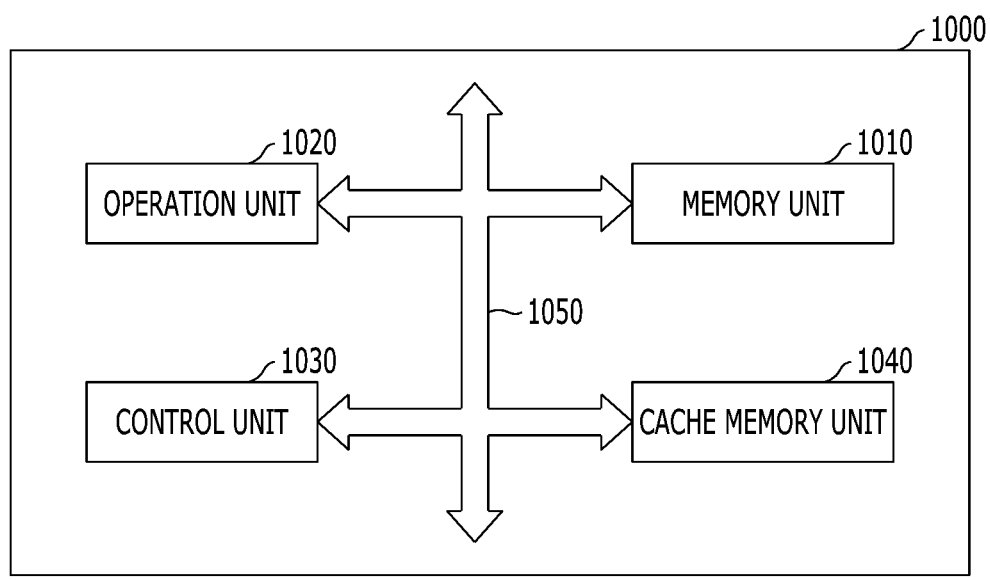
FIG. 9 illustrates a microprocessor implementing memory circuitry based on the disclosed technology.

FIG. 9 illustrates a microprocessor implementing memory circuitry based on the disclosed technology.

Referring to FIG. 9, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with embodiments. For example, the memory unit 1010 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates (−(k−n), 0), (k−n, 0), (0, k−n) and (0, −(k−n)) where k is a natural number and n is an integer in a range of 0 to (k−1). Through this, a size of a cell array of the memory unit 1010 may be increased and performance characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 10:
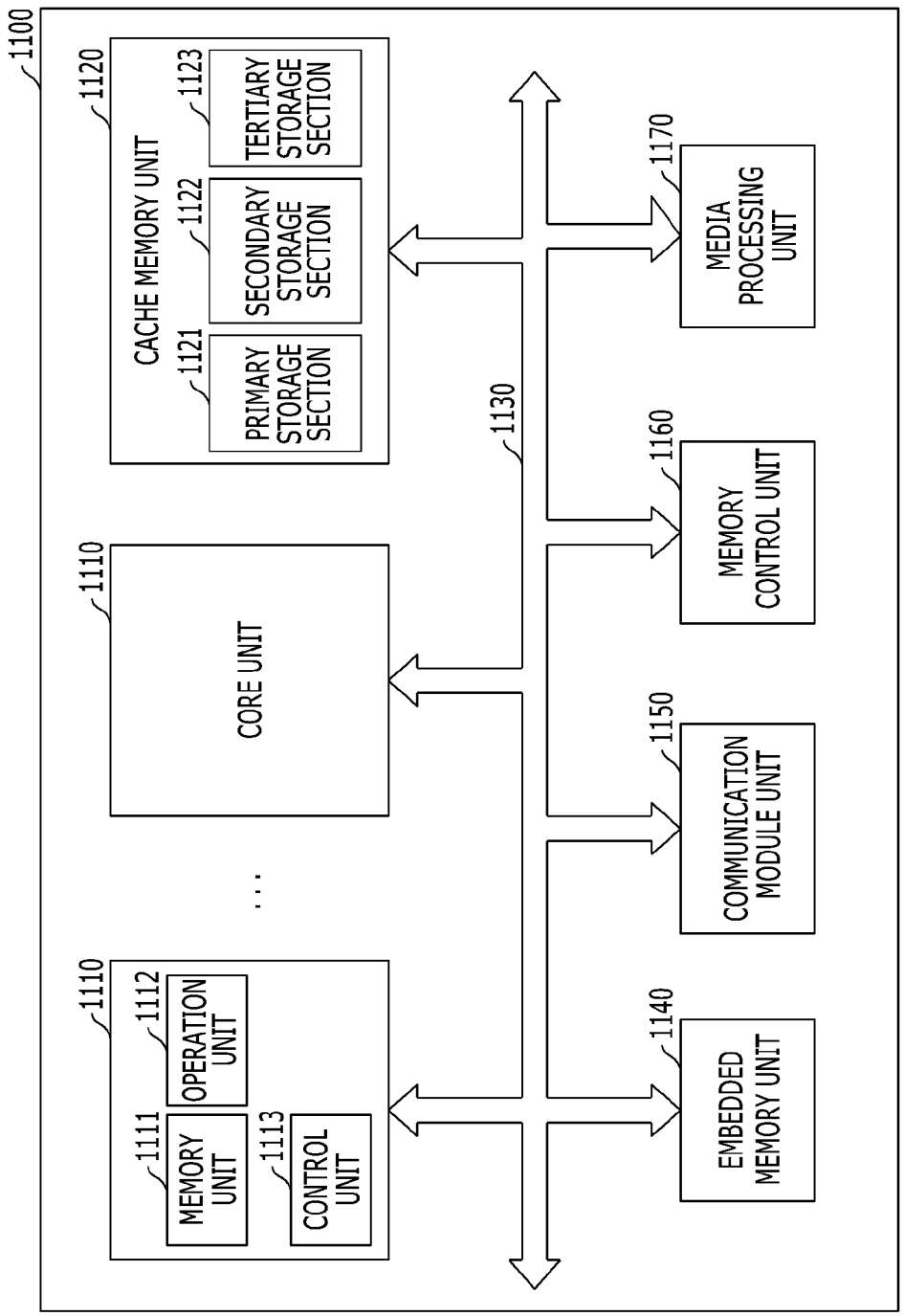
FIG. 10 illustrates a processor implementing memory circuitry based on the disclosed technology.

FIG. 10 illustrates a processor implementing memory circuitry based on the disclosed technology.

Referring to FIG. 10, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates $(-(k-n), 0)$, $(k-n, 0)$, $(0, k-n)$ and $(0, -(k-n))$ where k is a natural number and n is an integer in a range of 0 to $(k-1)$. Through this, a size of a cell array of the cache memory unit 1120 may be increased and performance characteristics of the cache memory unit 1120 may be improved. As a consequence, performance characteristics of the processor 1100 may be improved.

Although it was shown in FIG. 10 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
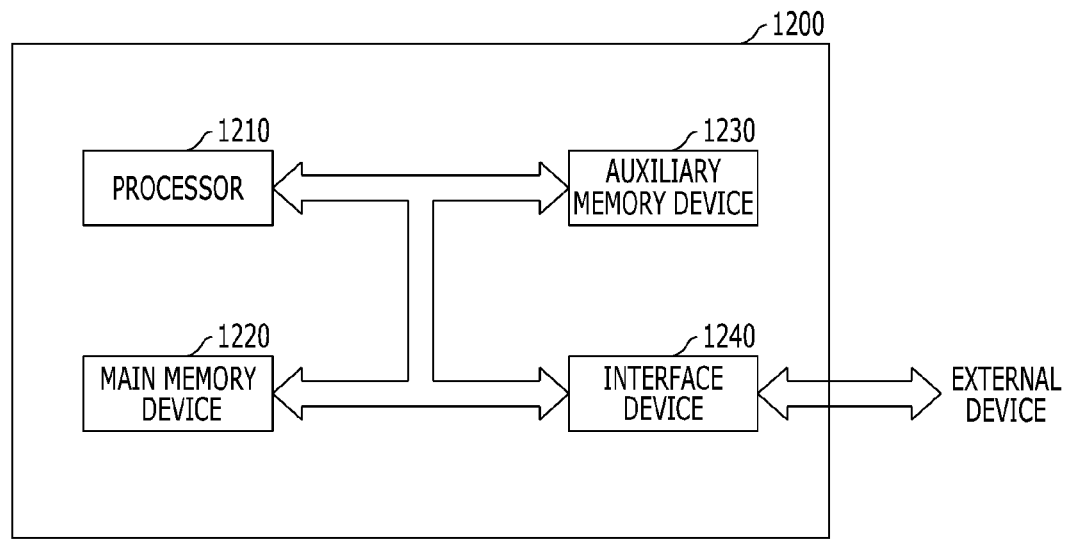
FIG. 11 illustrates a system implementing memory circuitry based on the disclosed technology.

FIG. 11 illustrates a system implementing memory circuitry based on the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the embodiments. For example, the main memory device 1220 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates (−(k−n), 0), (k−n, 0), (0, k−n) and (0, −(k−n)) where k is a natural number and n is an integer in a range of 0 to (k−1). Through this, a size of a cell array of the main memory device 1220 may be increased and performance characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates (−(k−n), 0), (k−n, 0), (0, k−n) and (0, −(k−n)) where k is a natural number and n is an integer in a range of 0 to (k−1). Through this, a size of a cell array of the auxiliary memory device 1230 may be increased and performance characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the embodiments, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 12:
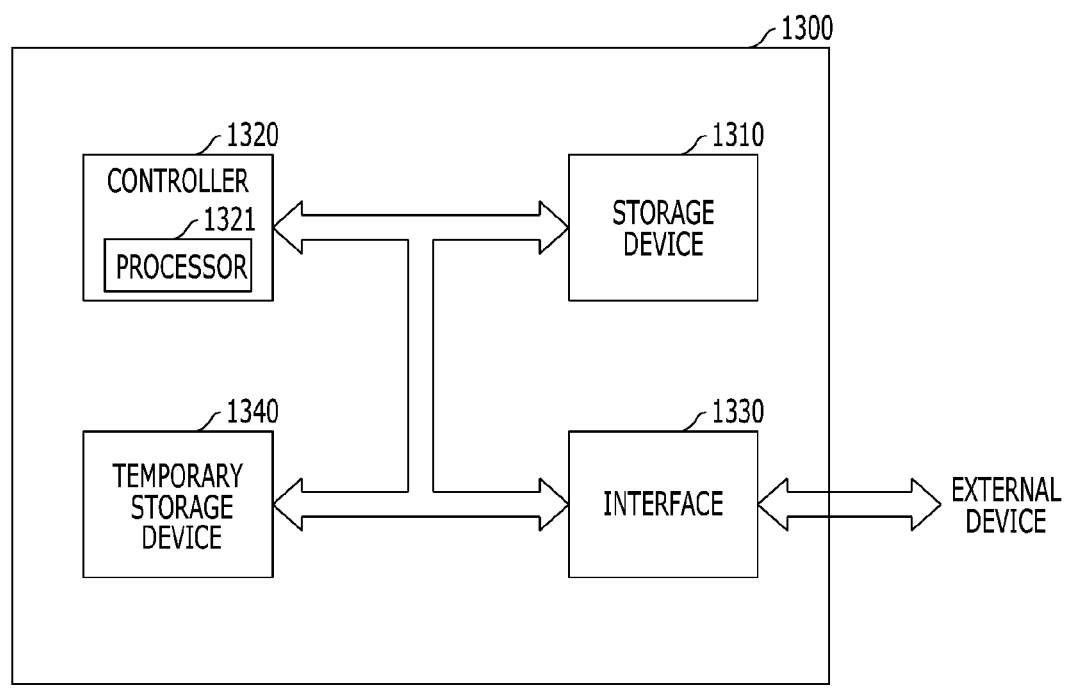
FIG. 12 illustrates a data storage system implementing memory circuitry based on the disclosed technology.

FIG. 12 illustrates a data storage system implementing memory circuitry based on the disclosed technology.

Referring to FIG. 12, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the embodiments. The temporary storage device 1340 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates (−(k−n), 0), (k−n, 0), (0, k−n) and (0, −(k−n)) where k is a natural number and n is an integer in a range of 0 to (k−1). Through this, a size of a cell array of the temporary storage device 1340 may be increased and performance characteristics of the temporary storage device 1340 may be improved. As a consequence, performance characteristics of the data storage system 1300 may be improved.

Figure 13:
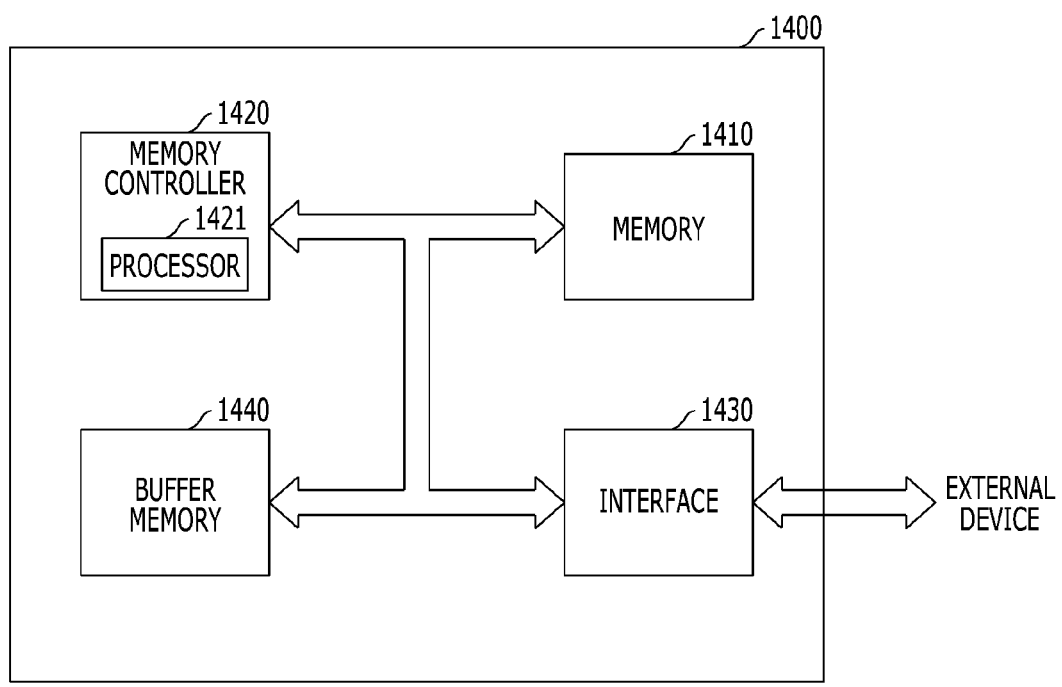
FIG. 13 illustrates a memory system implementing memory circuitry based on the disclosed technology.

FIG. 13 illustrates a memory system implementing memory circuitry based on the disclosed technology.

Referring to FIG. 13, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the embodiments. For example, the memory 1410 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates (−(k−n), 0), (k−n, 0), (0, k−n) and (0, −(k−n)) where k is a natural number and n is an integer in a range of 0 to (k−1). Through this, a size of a cell array of the memory 1410 may be increased and performance characteristics of the memory 1410 may be improved. As a consequence, performance characteristics of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the embodiments. The buffer memory 1440 may include first lines extending in a first direction; second lines extending in a second direction crossing the first direction; insulating patterns interposed between the first lines and the second lines and located at first intersections of intersections of the first lines and the second lines; and variable resistance patterns interposed between the first lines and the second lines and located at second intersections of the intersections of the first lines and the second lines, wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates (−(k−n), 0), (k−n, 0), (0, k−n) and (0, −(k−n)) where k is a natural number and n is an integer in a range of 0 to (k−1). Through this, a size of a cell array of the buffer memory 1440 may be increased and performance characteristics of the buffer memory 1440 may be improved. As a consequence, performance characteristics of the memory system 1400 may be improved.

Moreover, the buffer memory 1440 according to this embodiment may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the embodiments, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 9-13 based on a memory device in accordance with an embodiment disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments.

Only a few embodiments and examples are described. Other embodiments, enhancements and variations can be made based on what is described and illustrated in this disclosure.

What is claimed is:

1. An electronic device comprising a semiconductor memory unit, the semiconductor memory unit comprising:
    first lines extending in a first direction;
    second lines extending in a second direction crossing the first direction;
    insulating patterns interposed between the first lines and the second lines and located at first intersections of intersections of the first lines and the second lines; and
    variable resistance patterns interposed between the first lines and the second lines and located at second intersections of the intersections of the first lines and the second lines,
    wherein, when a central intersection defined by a central first line of the first lines and a central second line of the second lines corresponds to a coordinate (0, 0), the first intersections are located on first to $(n+1)^{th}$ virtual lines, the $(n+1)^{th}$ virtual line having a polygonal shape in which vertexes correspond to coordinates $(-(k-n), 0)$, $(k-n, 0)$, $(0, k-n)$ and $(0, -(k-n))$ where k is a natural number and n is an integer in a range of 0 to $(k-1)$.

2. The electronic device according to claim 1, wherein a cross-sectional shape and a plan shape of the variable resistance pattern are substantially the same as a cross-sectional shape and a plan shape of the insulating pattern, respectively.

3. The electronic device according to claim 1, wherein the insulating patterns include a material included in the variable resistance patterns, and further include impurities which cause a loss of a variable resistance characteristic of the material.

4. The electronic device according to claim 1, wherein the insulating patterns include a first oxide of a metal which substantially satisfies a stoichiometric ratio, and the variable resistance patterns include a second oxide of the metal that is deficient in oxygen compared to the stoichiometric ratio.

5. The electronic device according to claim 1, wherein the semiconductor memory unit further comprises an insulating layer filled in a space between the insulating patterns and the variable resistance patterns, and
    the insulating patterns and the insulating layer include a same insulating material.

6. The electronic device according to claim 1, wherein the number of the first lines is $(2k+1)$, and the number of the second lines is $(2k+1)$.

7. The electronic device according to claim 6, wherein first variable resistance patterns of the variable resistance patterns serve as dummy memory cells, and the first variable resistance patterns are coupled to the first and second lines which are coupled to the insulating patterns located at the vertexes of the first to $(n+1)^{th}$ virtual lines.

8. The electronic device according to claim 1, wherein the number of the first lines is $(2k+2)$, and the number of the second lines is $(2k+2)$, and
    wherein the electronic device includes first and second central first lines and first and second central second lines.

9. The electronic device according to claim 8, wherein, when n is equal to or greater than 1, first variable resistance patterns of the variable resistance patterns serve as dummy memory cells, and the first variable resistance patterns are coupled to the first and second lines which are coupled to the insulating patterns located at the vertexes of the first to $n^{th}$ virtual lines.

10. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit is a part of the memory unit in the microprocessor.

11. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit is a part of the cache memory unit in the processor.

12. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside, wherein the semiconductor memory unit is a part of the auxiliary memory device or the main memory device in the processing system.

13. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit is a part of the storage device or the temporary storage device in the data storage system.

14. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory unit is a part of the memory or the buffer memory in the memory system.

15. A method of manufacturing an electronic device comprising a semiconductor memory unit, the method comprising:
   forming first lines over a substrate;
   forming variable resistance patterns over the first lines, the variable resistance patterns being located at intersections of the first lines and second lines crossing the first lines;
   forming insulating patterns using some variable resistance patterns of the variable resistance patterns; and
   forming the second lines over the variable resistance patterns and the insulating patterns,
   wherein, when a central intersection defined by a central first line of the first lines and a central second line of the second lines corresponds to a coordinate (0, 0), the insulating patterns are located on first to $(n+1)^{th}$ virtual lines, the $(n+1)^{th}$ virtual line having a polygonal shape in which vertexes correspond to coordinates $(-(k-n), 0)$, $(k-n, 0)$, $(0, k-n)$ and $(0, -(k-n))$ where k is a natural number and n is an integer in a range of 0 to $(k-1)$.

16. The method according to claim 15, wherein the forming of the insulating patterns comprises:
   forming a mask pattern over a resultant structure including the variable resistance patterns, the mask pattern having an opening which exposes a region where the insulating patterns are to be formed; and
   doping impurities which cause a loss of a variable resistance characteristic of said some variable resistance patterns exposed by the opening.

17. The method according to claim 16, wherein the opening has a shape similar to a shape of each of the first to $(n+1)^{th}$ virtual lines while exposing all of the first to $(n+1)^{th}$ virtual lines.

18. The method according to claim 15, wherein the forming of the insulating patterns comprises:
   forming a mask pattern over a resultant structure including the variable resistance patterns, the mask pattern having an opening which exposes a region where the insulating patterns are to be formed;
   removing the variable resistance patterns exposed by the opening to form grooves; and
   filling the grooves with an insulating material.

19. The method according to claim 18, wherein the opening has a shape similar to a shape of each of the first to $(n+1)^{th}$ virtual lines while exposing all of the first to $(n+1)^{th}$ virtual lines.

* * * * *